(12) United States Patent
Mucha et al.

(10) Patent No.: US 9,451,359 B2
(45) Date of Patent: Sep. 20, 2016

(54) PREAMPLIFIER FOR A MICROPHONE

(71) Applicant: INVENSENSE, INC., San Jose, CA (US)

(72) Inventors: Igor Mucha, Bratislava (SK); Tomáš Piták, Bratislava (SK); James Salvia, Belmont, CA (US); Baris Cagdaser, Sunnyvale, CA (US)

(73) Assignee: INVENSENSE, INC., San Jose, CA (US)

( * ) Notice: Subject to any disclaimer, the term of this patent is extended or adjusted under 35 U.S.C. 154(b) by 59 days.

(21) Appl. No.: 14/553,973

(22) Filed: Nov. 25, 2014

(65) Prior Publication Data

US 2016/0149542 A1    May 26, 2016

(51) Int. Cl.
  *H04R 3/00*    (2006.01)
  *H03F 3/183*    (2006.01)

(52) U.S. Cl.
  CPC ............... *H04R 3/00* (2013.01); *H03F 3/183* (2013.01); *H03F 2200/03* (2013.01); *H03F 2200/372* (2013.01); *H03F 2200/375* (2013.01); *H03F 2200/444* (2013.01)

(58) Field of Classification Search
  None
  See application file for complete search history.

(56) References Cited

U.S. PATENT DOCUMENTS

| | | | | |
|---|---|---|---|---|
| 3,992,584 A | * | 11/1976 | Dugan | H04R 3/005 381/107 |
| 6,952,621 B1 | * | 10/2005 | Malcolm, Jr. | H04H 60/04 381/1 |
| 7,259,627 B1 | * | 8/2007 | Dhanasekaran | H03F 3/181 330/259 |

* cited by examiner

*Primary Examiner* — Muhammad N Edun
(74) *Attorney, Agent, or Firm* — Amin, Turocy & Watson, LLP

(57) ABSTRACT

Systems and techniques for processing a signal associated with a microphone are presented. The system includes a microphone component and a preamplifier. The microphone component is contained in a housing. The preamplifier includes an input buffer that receives a signal generated by the microphone component. The input buffer also generates an output signal that comprises a direct current (DC) voltage offset in comparison to the signal, where the preamplifier controls a degree of the DC voltage offset based on a control signal.

21 Claims, 14 Drawing Sheets

PREAMPLIFIER FOR A MICROPHONE

TECHNICAL FIELD

The subject disclosure relates to processing a signal associated with a microphone.

BACKGROUND

Microphones are widely integrated in consumer electronic devices. A microphone of a consumer electronic device is typically coupled to a preamplifier. The preamplifier can, for example, prepare a microphone signal of the microphone (e.g., increase signal strength of the microphone signal, etc.) for further processing by other component(s) of the consumer electronic device. However, a signal provided by a conventional preamplifier for a microphone of a consumer electronic device is often associated with an undesirable cut-off frequency, higher noise than a microphone signal of the microphone and/or higher distortion than a microphone signal of the microphone. Moreover, processing capabilities of a conventional preamplifier for a microphone of a consumer electronic device (e.g., amplitude of a microphone signal that can be processed without distortion) is often limited.

It is thus desired to provide a preamplifier that improves upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In accordance with an implementation, a system includes a microphone component and a preamplifier. The microphone component is contained in a housing. The preamplifier includes an input buffer that receives a signal generated by the microphone component. The input buffer also generates an output signal that comprises a direct current (DC) voltage offset in comparison to the signal, where the preamplifier controls a degree of the DC voltage offset based on a control signal.

In accordance with another implementation, a device includes an input buffer component. The input buffer component receives an input voltage associated with a sensor, receives a control voltage, and generates an output voltage based at least on the control voltage, where the input buffer is associated with a first impedance that is different than a second impedance associated with the sensor.

In accordance with yet another implementation, a method provides for receiving a voltage generated by a microphone component, receiving a control voltage, and generating an output voltage by processing the voltage generated by the microphone component based at least on the control voltage.

These and other embodiments are described in more detail below.

BRIEF DESCRIPTION OF THE DRAWINGS

Various non-limiting embodiments are further described with reference to the accompanying drawings, in which.

DETAILED DESCRIPTION

Overview

Figure 1:
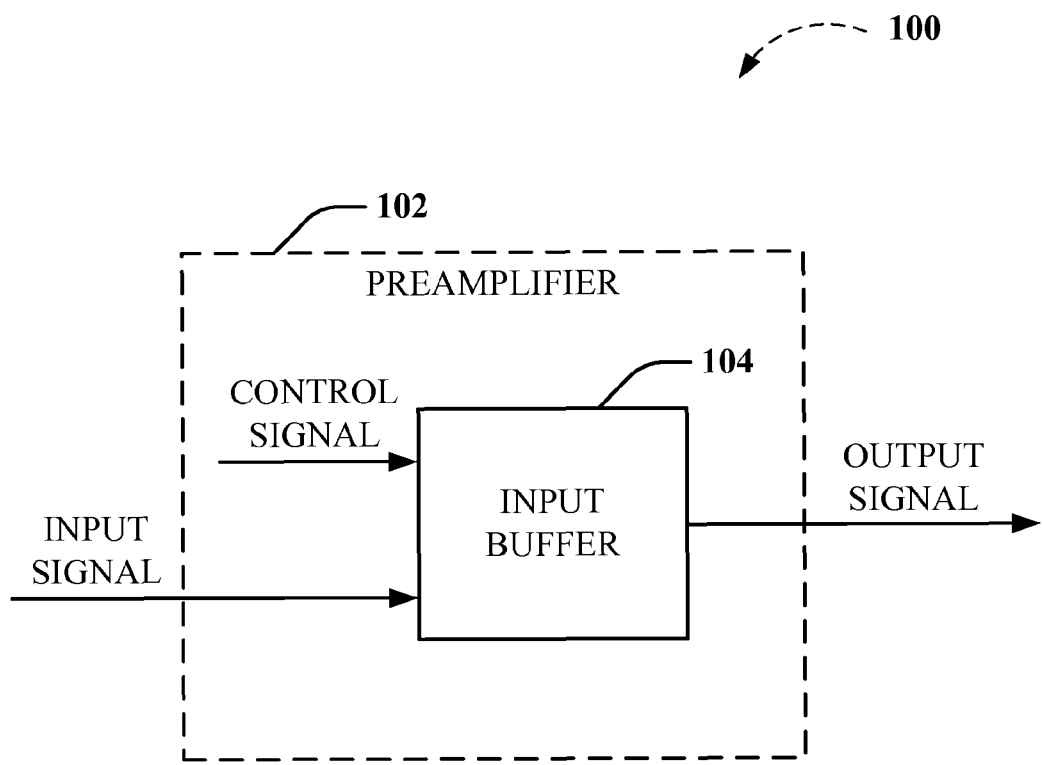
FIG. 1 depicts a functional block diagram of a preamplifier, in accordance with various aspects and implementations described herein.

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

As described above, a signal provided by a conventional preamplifier for a microphone of a consumer electronic device is often associated with an undesirable cut-off frequency, higher noise than a microphone signal of the microphone and/or higher distortion than a microphone signal of the microphone. Moreover, processing capabilities of a conventional preamplifier for a microphone of a consumer electronic device (e.g., amplitude of a microphone signal that can be processed without distortion) is often limited To these and/or related ends, various aspects for processing a signal associated with a microphone are described. The various embodiments of the apparatuses, techniques, and methods of the subject disclosure are described in the context of a buffer (e.g., a buffer of a preamplifier) employed in connection with a microphone (e.g., a capacitive microphone, etc.). Exemplary embodiments of the subject disclosure employ a buffer to, for example, improve cut-off frequency associated with a signal provided by a preamplifier, minimize noise of a signal provided by a preamplifier, minimize distortion of a signal provided by a preamplifier and/or improve signal processing capabilities (e.g., an overload point, etc.) of a preamplifier.

According to an aspect, a preamplifier can include a buffer (e.g., an input buffer). The buffer can generate an output signal based on a control signal and a signal associated with a microphone. The output signal can comprise a direct current (DC) voltage offset in comparison to the signal associated with the microphone. Furthermore, a degree of the DC voltage offset can be controlled based on the control signal. In one example, the preamplifier can be an impedance converter preamplifier. In a non-limiting implementation, the buffer can be a buffer transistor configured in a source follower configuration. Threshold voltage, and therefore gate-to-source voltage, of the buffer transistor can be controlled based on bulk-to-source voltage of the buffer transistor (e.g., without altering saturation voltage of the buffer transistor).

However, as further detailed below, various exemplary implementations can be applied to other areas of a preamplifier for a microphone, without departing from the subject matter described herein.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

FIG. 1 depicts a functional block diagram of a system 100 for processing (e.g., conditioning) a signal associated with a microphone, according to various non-limiting aspects of the subject disclosure. The system 100 includes a preamplifier 102. For example, the preamplifier 102 can be a preamplifier associated with a microphone (e.g., a microphone component, a microphone element, a microphone sensor, etc.). The preamplifier 102 can include at least an input buffer 104 (e.g., input buffer component). The input buffer 104 can receive an input signal (e.g., INPUT SIGNAL shown in FIG. 1) and a control signal (e.g., CONTROL SIGNAL shown in FIG. 1). The input signal can be an input voltage and the control signal can be a control voltage. In an aspect, the input signal can be a signal (e.g., a voltage) generated by a microphone (e.g., a microphone component, a microphone element, a microphone sensor, etc.). For example, the input signal can be associated with a terminal of a microphone (e.g., a terminal of a microphone component, a terminal of a microphone element, a terminal of a microphone sensor, etc.). In an implementation, a microphone housing (e.g., a microphone module) can include the preamplifier 102 and/or a microphone component that generates the input signal.

The input buffer 104 can generate an output signal (e.g., OUTPUT SIGNAL shown in FIG. 1) by processing (e.g., conditioning) the input signal. For example, the output signal can be a processed version (e.g., conditioned version) of the input signal. The output signal can be an output voltage. In one example, the output signal can include a DC voltage offset in comparison to the input signal. In another example, the output signal can be associated with a higher DC voltage than a DC voltage associated with the input signal. The output signal can be generated based on the input signal and the control signal. For example, the control signal can control a degree of the DC voltage offset associated with the output signal (e.g., preamplifier 102 and/or the input buffer 104 can control a degree of the DC voltage offset associated with the output signal based on the control signal). In an aspect, the input buffer 104 can act as an adjustable voltage source adjusted by the control signal. In another aspect, the preamplifier 102 can be implemented as an impedance converter.

In an implementation, the input buffer 104 can be a metal-oxide-semiconductor field-effect (MOSFET) transistor. For example, the input buffer 104 can be a MOSFET transistor biased by a current source. However, it is to be appreciated that the input buffer 104 can be implemented as a different type of transistor. In an aspect, a bulk terminal (e.g., a body terminal) of the input buffer 104 (e.g., the MOSFET transistor) can be controlled by the control signal. In another implementation, the input buffer 104 can be implemented as a set of transistors. For example, the input buffer 104 can be associated with at least one operational transconductance amplifier (OTA). In another example, the input buffer 104 can be associated with at least one operational amplifier (op-amp). In yet another example, the input buffer 104 can be associated with at least one unity gain buffer amplifier. However, it is to be appreciated that the input buffer 104 can be implemented as and/or associated with a different type of buffer configuration. The output signal generated by the input buffer 104 can be associated with greater signal processing capability than the input signal (e.g., the output signal can be associated with an improved waveform, an improved signal excursion threshold, an improved cut-off frequency, etc.). Furthermore, the output signal can be associated with minimal noise and/or distortion. The output signal can be provided, in certain implementations, to one or more signal conditioning stages (e.g., a gain stage, etc.) and/or an analog-to-digital converter.

Figure 2:
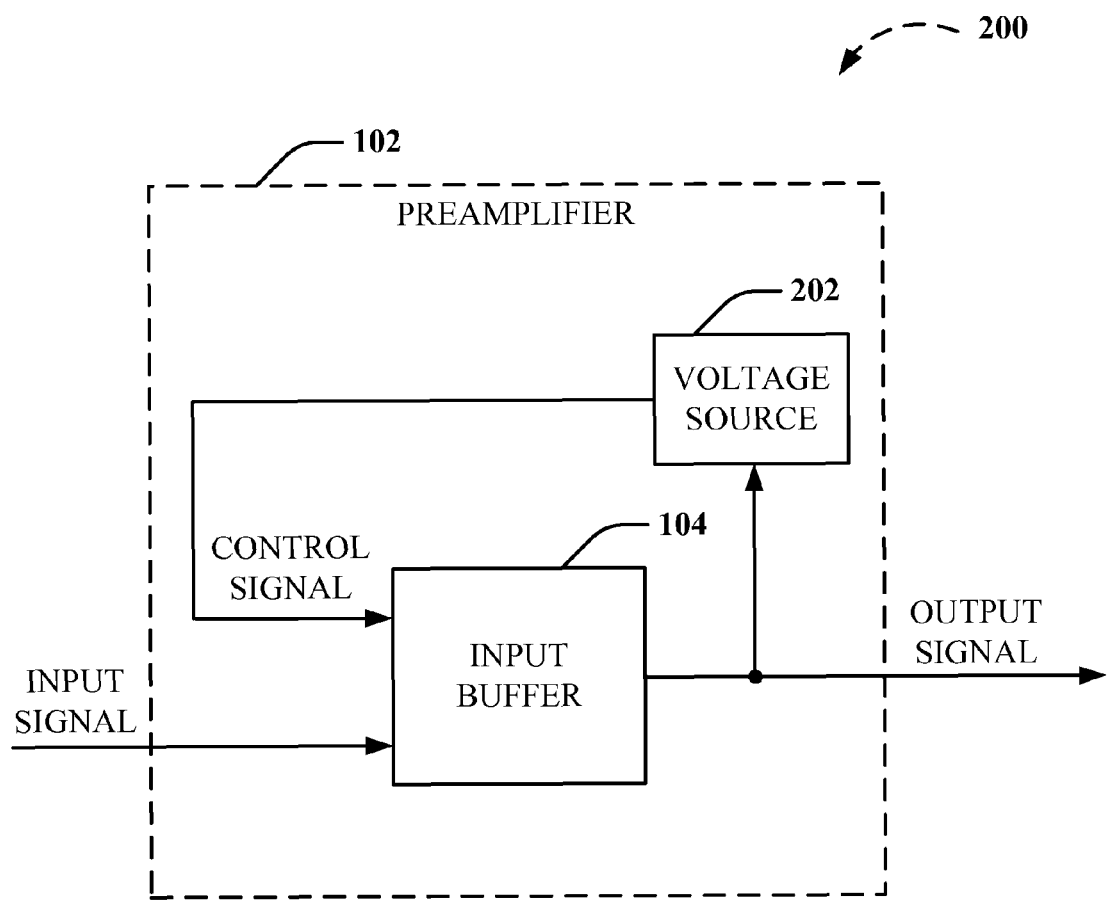
FIG. 2 depicts another functional block diagram of a preamplifier, in accordance with various aspects and implementations described herein.

FIG. 2 depicts a functional block diagram of a system 200 for processing (e.g., conditioning) a signal associated with a microphone, according to various non-limiting aspects of the subject disclosure. The system 200 includes the preamplifier 102. The preamplifier 102 can include at least the input buffer 104 and a voltage source 202 (e.g., voltage source component). In the embodiment shown in FIG. 2, the voltage source 202 can generate the control signal. For example, the voltage source 202 can receive the output signal generated by the input buffer 104. Furthermore, the voltage source 202 can generate the control signal based on the output signal (e.g., the control signal can be generated based on the output signal and the voltage source 202). In one implementation, the voltage source 202 can be a constant voltage source. In another implementation, the voltage source 202 can be an adjustable voltage source.

In an aspect, the voltage source 202 can include a transistor. Additionally, the voltage source 202 can include a resistor (e.g., a resistive component). The voltage source 202 can be a resistance where current flows from a terminal of the voltage source 202 associated with the output signal to another terminal of the voltage source 202 associated with the control signal. For example, the voltage source 202 can comprise a bias current source to facilitate generating the control signal. In another aspect, the voltage source 202 can be a level shifter (e.g., a passive level shifter or an active level shifter). For example, the voltage source 202 can convert a voltage associated with the output signal to another voltage associated with the control signal.

Figure 3:
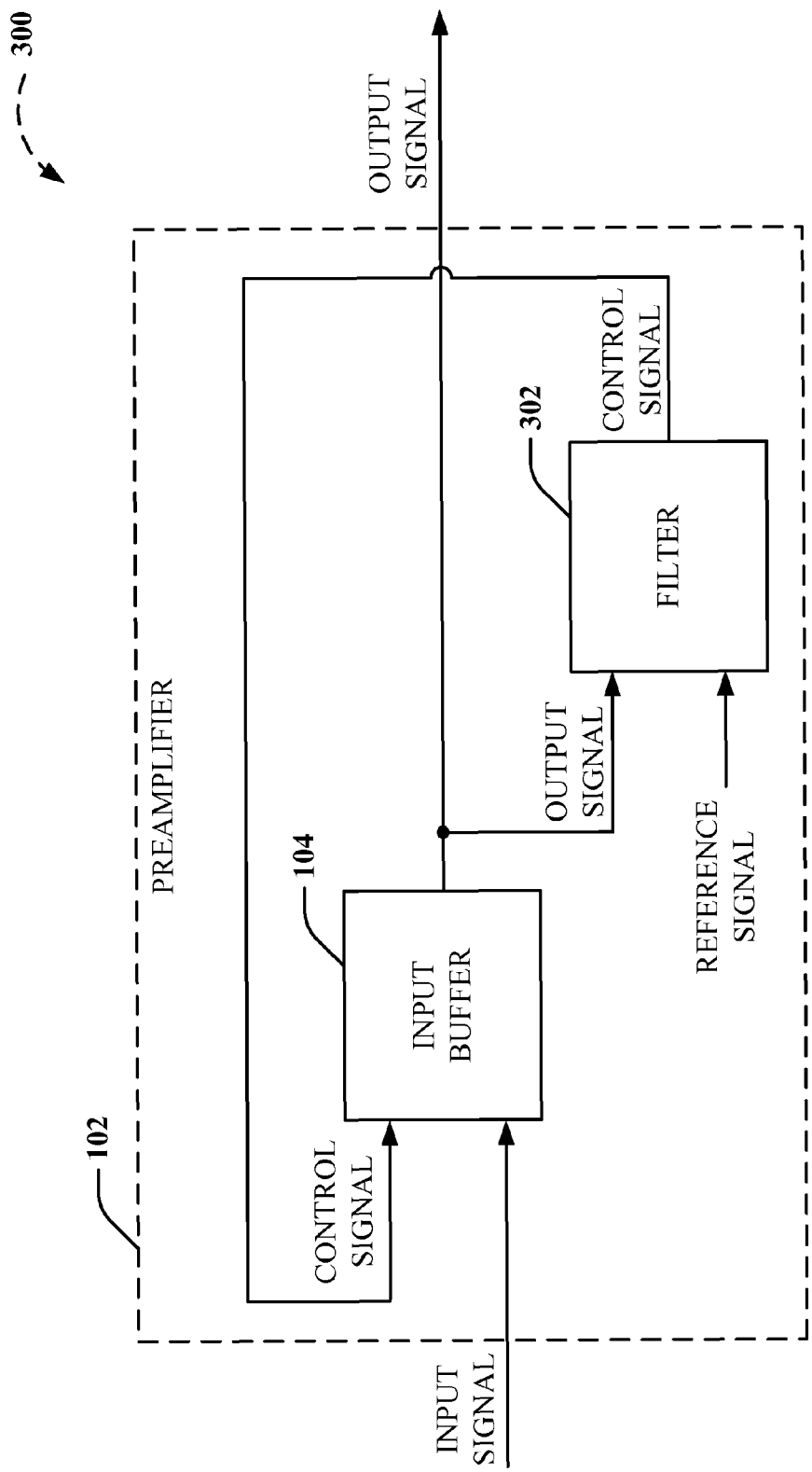
FIG. 3 depicts yet another functional block diagram of a preamplifier, in accordance with various aspects and implementations described herein.

FIG. 3 depicts a functional block diagram of a system 300 for processing (e.g., conditioning) a signal associated with a microphone, according to various non-limiting aspects of the subject disclosure. The system 300 includes the preamplifier 102. The preamplifier 102 can include at least the input buffer 104 and a filter 302 (e.g., filter component). In the embodiment shown in FIG. 3, the filter 302 can generate the control signal. For example, the filter 302 can receive a reference signal (e.g., REFERENCE SIGNAL shown in FIG. 3). The reference signal can be a reference voltage. Furthermore, the filter 302 can generate the control signal based on the output signal and the reference signal (e.g., the control signal can be generated by the filter 302 that receives the output signal and the reference signal). For example, an alternating current (AC) component of the control signal can be determined by an AC component of the output signal. Furthermore, a DC level shift component of the control signal can be determined based on the reference signal. The reference signal can be associated with a higher voltage (e.g., a higher DC voltage) than the output signal. In an aspect, the reference signal can be generated by a bandgap voltage reference circuit. In another aspect, the reference signal can be generated by a stable voltage source. However, it is to be appreciated that the reference signal can be generated by a different technique. The filter 302 can be a passive filter or an active filter. The filter 302 can include at least one resistor, at least one capacitor and/or at least one inductor. For example, the filter 302 can be configured as a RC filter, a RL filter, a LC filter or a RLC filter. Additionally or alternatively, the filter 302 can include one or more other types of components.

Figure 4:
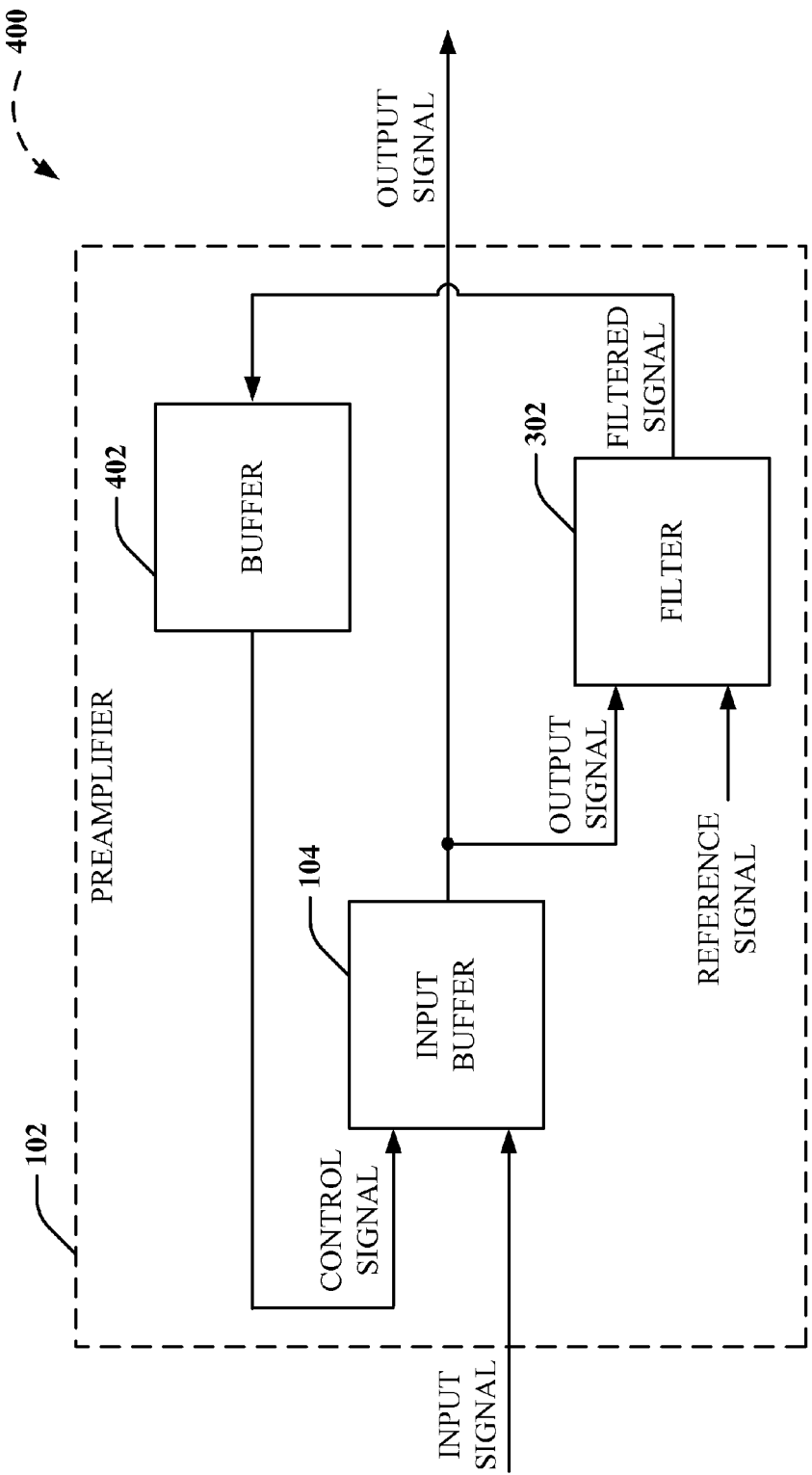
FIG. 4 depicts yet another functional block diagram of a preamplifier, in accordance with various aspects and implementations described herein.

FIG. 4 depicts a functional block diagram of a system 400 for processing (e.g., conditioning) a signal associated with a microphone, according to various non-limiting aspects of the subject disclosure. The system 400 includes the preamplifier 102. The preamplifier 102 can include at least the input buffer 104, the filter 302 and a buffer 402 (e.g., buffer component). In the embodiment shown in FIG. 4, the buffer 402 can generate the control signal. For example, the input buffer 104 can be coupled to the filter 302 (e.g., the filter 302 that receives the output signal and the reference signal) and to the buffer 402 that generates the control signal. The buffer 402 can generate the control signal based on a filtered signal (e.g., FILTERED SIGNAL shown in FIG. 4) generated by the filter 302. For example, an alternating current (AC) component of the filtered signal can be determined by an AC component of the output signal. Furthermore, a DC level shift component of the filtered signal can be determined based on the reference signal. The buffer 402 can alter an impedance associated with the filtered signal. For example, an impedance associated with the control signal generated by the buffer 402 can be lower than an impedance associated with the filtered signal. Accordingly, the buffer 402 can be implemented as an impedance converter.

Figure 5:
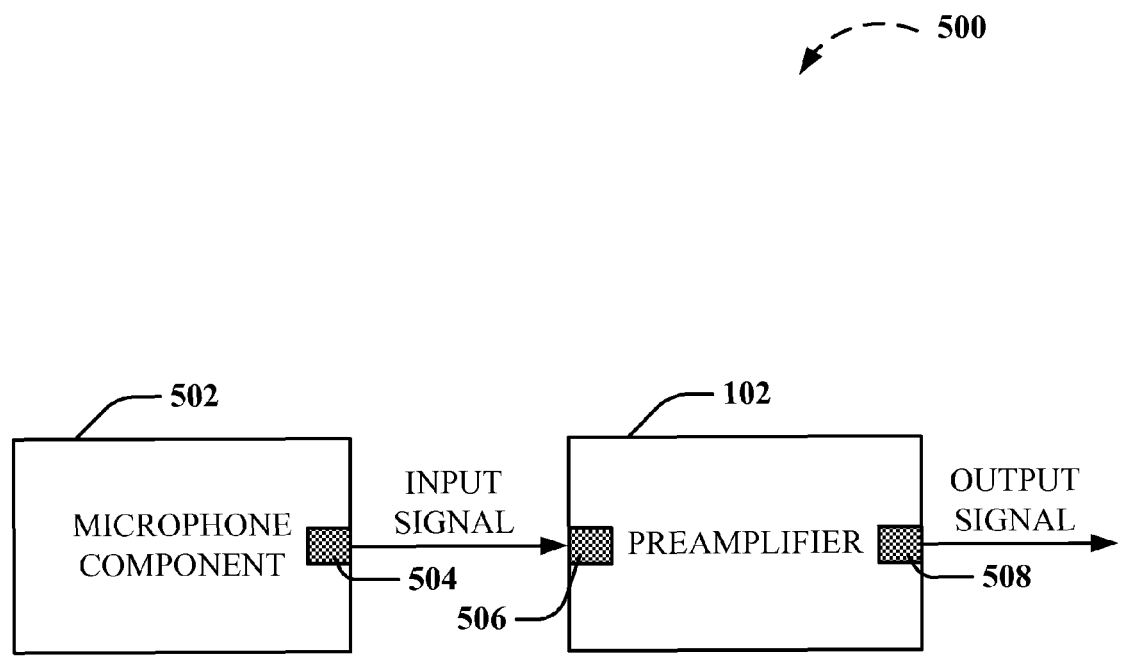
FIG. 5 depicts a functional block diagram of a system including a preamplifier and a microphone component, in accordance with various aspects and implementations described herein.

FIG. 5 depicts a functional block diagram of a system 500 for processing (e.g., conditioning) a signal associated with a microphone, according to various non-limiting aspects of the subject disclosure. The system 500 includes a microphone component 502 and the preamplifier 102. The microphone component 502 can include a terminal 504. The preamplifier 102 can include a terminal 506 and a terminal 508. The system 500 can be included in and/or associated with a consumer electronic device. For example, the preamplifier 102 and/or the microphone component 502 can be included in and/or associated with a phone, a smartphone, a smartwatch, a tablet, an eReader, a netbook, an automotive navigation device, a gaming console or device, a wearable computing device, another type of computing device, etc. The preamplifier 102 can be mechanically, electrically, and/or communicatively coupled to the microphone component 502. In an aspect, the microphone component 502 can be included in a housing (e.g., a microphone module). In one example, the preamplifier 102 can also be included in the housing that contains the microphone component 502. In another example, the preamplifier 102 can be implemented outside the housing that contains the microphone component 502. In certain implementations, the preamplifier 102 can be associated with an application specific integrated circuit (ASIC).

The microphone component 502 can be associated with a capacitive microphone, a piezoelectric microphone, a piezoresistive microphone, an electret condenser microphone, a MEMS microphone, another type of microphone, etc. In an implementation, the microphone component 502 can be a microelectromechanical systems (MEMS) microphone component. For example, the microphone component 502 can be, but is not limited to, a MEMS microphone, a MEMS sensor, a MEMS acoustic sensor, etc. In another implementation, the microphone component 502 can be an electret condenser microphone (ECM) component. For example, the microphone component 502 can be, but is not limited to, an ECM microphone, an ECM sensor, an ECM acoustic sensor, etc. In an aspect, the preamplifier 102 can be implemented with the microphone component 502 to form a capacitive microphone sensor.

The terminal 504 of the microphone component 502 can be coupled to the terminal 506 of the preamplifier 102. As such, the input signal generated by the microphone component 502 can be provided to the terminal 506 of the preamplifier 102 via the terminal 504 of the microphone component 502 (e.g., the input signal can be associated with the terminal 504 and the terminal 508). The terminal 504 of the microphone component 502 can be associated with a plate of a microphone (e.g., a plate of a microphone diaphragm). In one example, the terminal 506 of the preamplifier 102 can be a terminal associated with a gate of the input buffer 104. The terminal 508 of the preamplifier 102 can be associated with the output signal generated by the preamplifier 102. The preamplifier 102 (e.g., the input buffer 104) can be associated with an impedance that is different than an impedance of the microphone component 502. For example, an impedance associated with the terminal 504 of the microphone component 502 can be different than an impedance associated with the terminal 508 of the preamplifier 102 (e.g., the terminal 508 of the preamplifier can be associated with a lower impedance than the terminal 504 of the microphone component 502). Furthermore, DC voltage at the terminal 508 of the preamplifier 102 can be different than (e.g., greater than) DC voltage associated with the terminal 504 of the microphone component 502.

Figure 6:
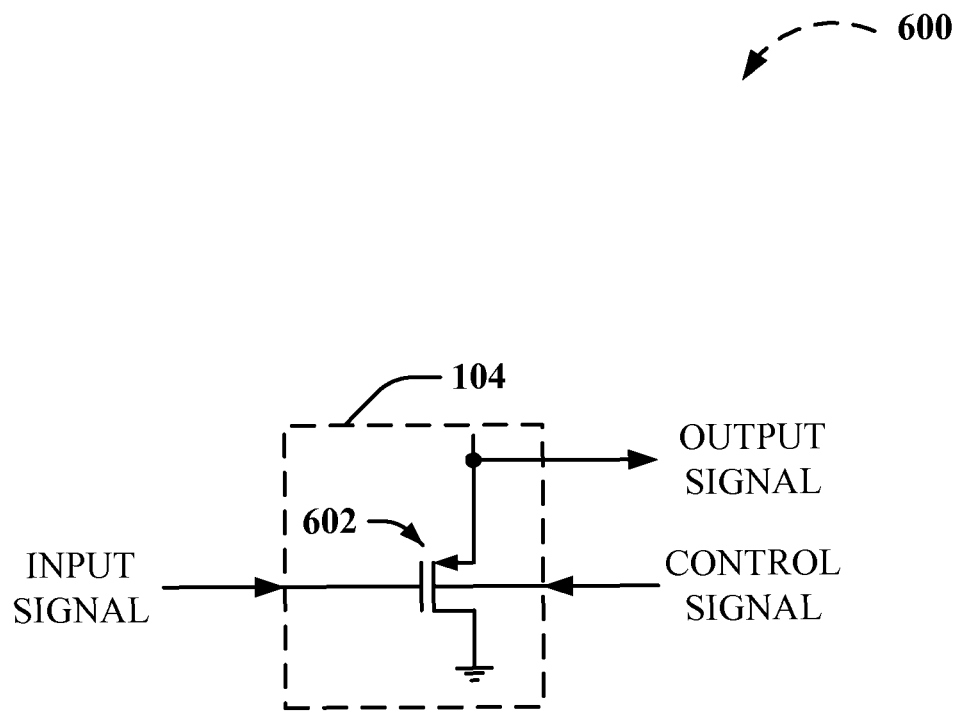
FIG. 6 depicts a non-limiting example of a circuit for a preamplifier, in accordance with various aspects and implementations described herein.

FIG. 6 depicts a circuit 600 for processing (e.g., conditioning) a signal associated with a microphone, according to various non-limiting aspects of the subject disclosure. The circuit 600 can correspond to the preamplifier 102. The circuit 600 includes a transistor 602. For example, the input buffer 104 can include and/or be implemented as the transistor 602. In one example, the transistor 602 can be a MOSFET transistor (e.g., a p-channel MOSFET transistor). However, it is to be appreciated that the transistor 602 can be implemented as a different type of transistor. The transistor 602 can be implemented in a source follower (e.g., a buffer) configuration. The output signal can be generated by controlling a bulk-to-source voltage of the transistor 602. For example, a bulk-to-source voltage of the transistor 602 can be employed to control threshold voltage of the transistor 602 (e.g., increase threshold voltage of the transistor 602), and therefore also gate-to-source voltage of the transistor 602, without altering saturation voltage of the transistor 602. The transistor 602 can be configured to process (e.g., condition) the input signal associated with the microphone component 502. A gate terminal of the transistor 602 (e.g., the terminal 506 shown in FIG. 5) can receive the input signal associated with the microphone component 502. A bulk terminal (e.g., a body terminal) of the transistor 602 can receive the control signal. For example, the bulk terminal of the transistor 602 can be controlled (e.g., driven) by the control signal. In an aspect, the control signal can be received by the bulk terminal of the transistor 602 to control a degree of DC voltage offset of the output signal in comparison to the input signal received by the gate terminal of the transistor 602.

A source terminal of the transistor 602 can transmit the output signal. A drain terminal of the transistor 602 can be coupled to ground. In an aspect, the transistor 602 can be biased (e.g., via the source terminal of the transistor 602) by a current source. In one example, the source terminal of the transistor 602 can be coupled to an output terminal of the preamplifier 102 that provides the output signal (e.g., the terminal 508 shown in FIG. 5). Therefore, DC voltage at the output terminal of the preamplifier 102 (e.g., the terminal 508 shown in FIG. 5) can be greater than a DC voltage associated with the input signal (e.g., threshold voltage of the transistor 602 can be increased). Furthermore, signal processing capability of the output signal associated with the output terminal of the preamplifier 102 (e.g., the terminal 508 shown in FIG. 5) can be increased while minimizing distortion and/or noise. For example, signal processing capability of the output signal generated by the transistor 602 can be greater than signal processing capability of the input signal received by the transistor 602.

Figure 7:
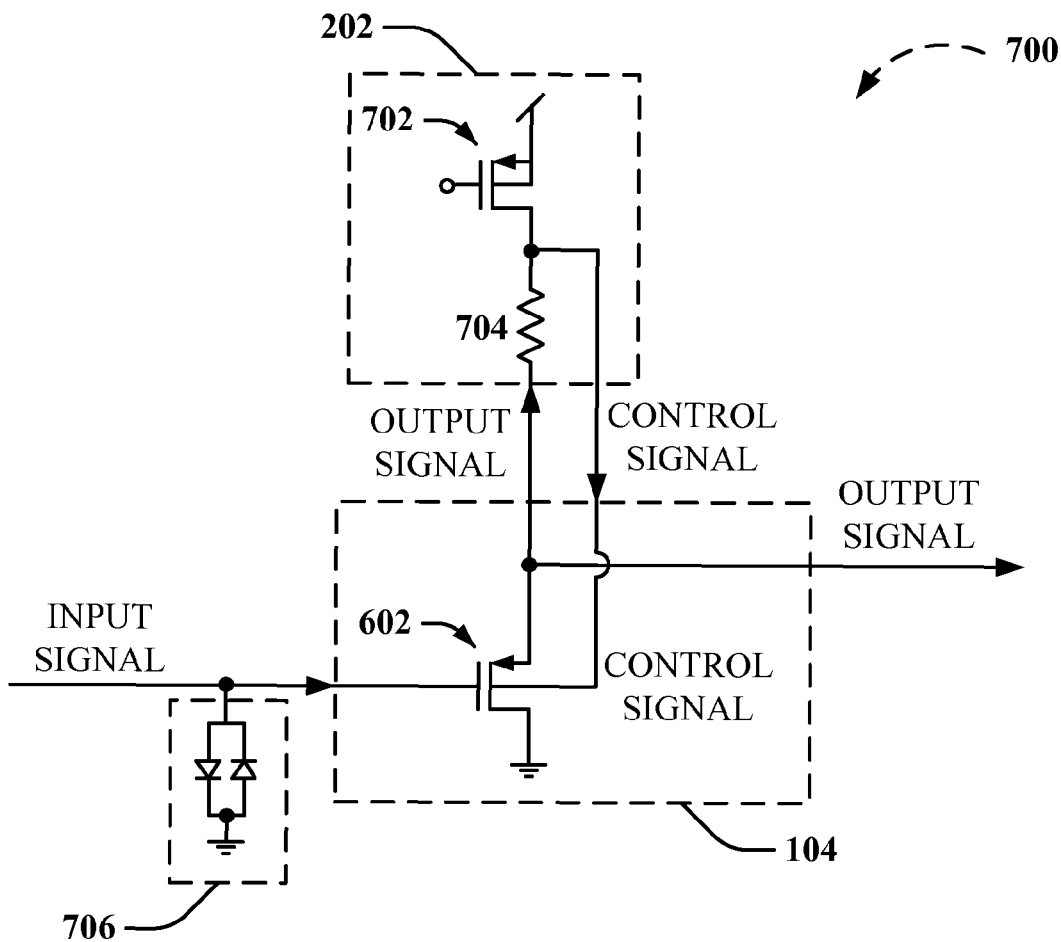
FIG. 7 depicts another non-limiting example of another circuit for a preamplifier, in accordance with various aspects and implementations described herein.

FIG. 7 depicts a circuit 700 for processing (e.g., conditioning) a signal associated with a microphone, according to various non-limiting aspects of the subject disclosure. The circuit 700 can correspond to the preamplifier 102. The circuit 700 includes the transistor 602, a transistor 702 and a resistor 704. For example, the voltage source 202 can include and/or be implemented as the transistor 702 and/or the resistor 704. In one example, the transistor 702 can be a MOSFET transistor. In certain implementations, rather than a resistor, the resistor 704 can be a switch capacitor resistor or a MOSFET transistor biased to act as a resistor.

The transistor 702 can be implemented as a bias current source. For example, the transistor 702 can provide a particular bias current to the transistor 602 (e.g., the transistor 702 can be employed to bias the transistor 602). A gate terminal of the transistor 702 can be coupled to a voltage source that generates a voltage to control the gate terminal of the transistor 702. For example, the gate terminal of the transistor 702 can be coupled to a current mirror, an op-amp, an OTA, a transistor/diode circuit configuration, a transistor configuration, or another voltage source, etc. that is configured to provide a voltage to control the gate terminal of the transistor 702. A bulk terminal of the transistor 702 can be coupled to a source terminal of the transistor 702. The source terminal of the transistor 702 can be coupled to a power supply (e.g., an external power supply, an internal power supply, a regulated power supply, etc.). A drain terminal of the transistor 702 can be coupled to the bulk terminal of the transistor 602. Furthermore, the drain terminal of the transistor 702 can be coupled to a terminal of the resistor 704. Another terminal of the resistor 704 can be coupled to the source terminal of the transistor 602 and/or can be associated with the output signal. The resistor 704 can be a resistance that is implemented between the drain terminal of the transistor 702 and the source terminal of the transistor 602. Therefore, a DC voltage can be established across the resistor 704 and can be employed to bias the bulk terminal of the transistor 602. The output signal (e.g., the output voltage) can be present at both ends of the resistor 704. In certain implementations, the circuit 700 can also include a set of diodes 706. The set of diodes 706 can be configured as anti-parallel diodes. The set of diodes 706 can be coupled to the gate terminal of the transistor 602. Therefore, the gate terminal of the transistor 602 can be biased to ground by a high impedance resistance formed by the set of diodes 706.

Figure 8:
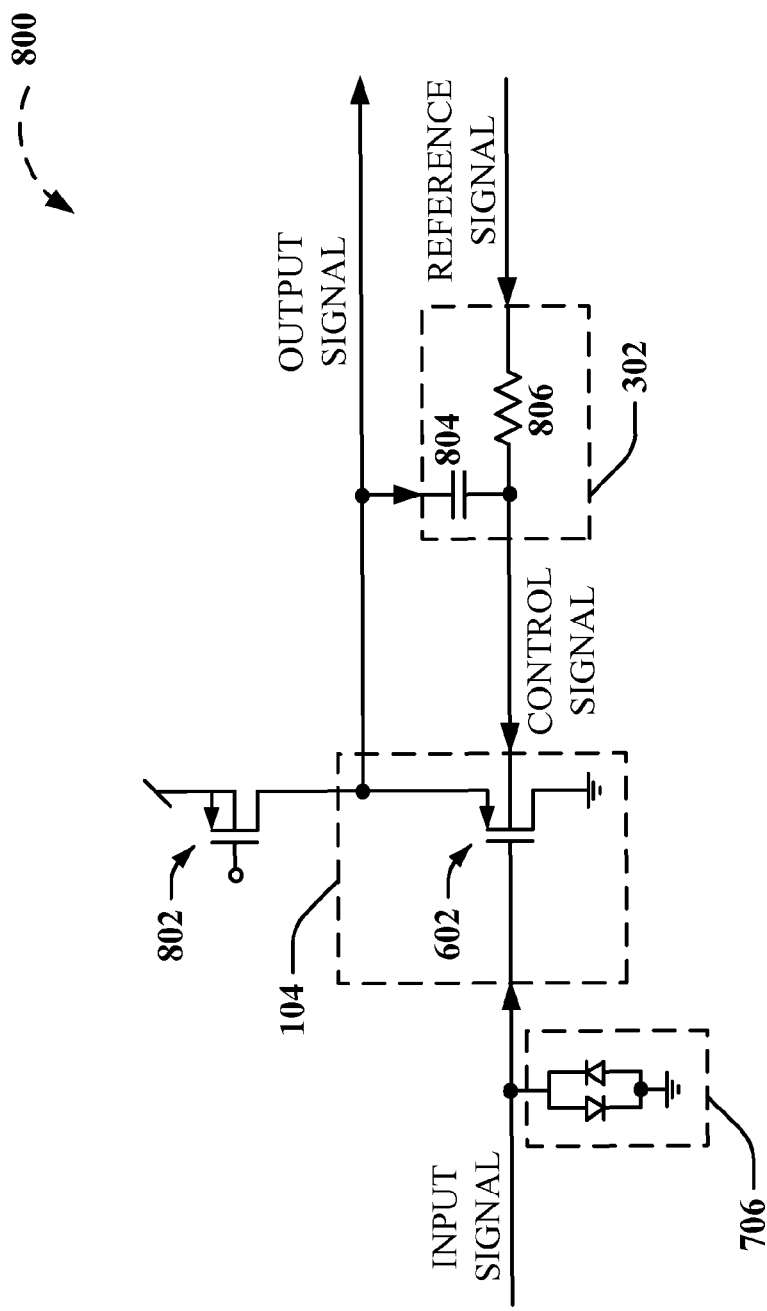
FIG. 8 depicts another non-limiting example of yet another circuit for a preamplifier, in accordance with various aspects and implementations described herein.

FIG. 8 depicts a circuit 800 for processing (e.g., conditioning) a signal associated with a microphone, according to various non-limiting aspects of the subject disclosure. The circuit 800 can correspond to the preamplifier 102. The circuit 800 includes the transistor 602, a transistor 802, a capacitor 804 and a resistor 806. For example, the filter 302 can include and/or be implemented as the capacitor 804 and/or the resistor 806. In one example, the transistor 802 can be a MOSFET transistor. In certain implementations, rather than a resistor, the resistor 806 can be a switch capacitor resistor or a MOSFET transistor biased to act as a resistor.

The transistor 802 can be implemented as a current source (e.g., a bias current source). For example, the transistor 802 can provide a particular bias current to the transistor 602 (e.g., the transistor 802 can be employed to bias the transistor 602). A gate terminal of the transistor 802 can be coupled to a voltage source that generates a voltage to control the gate terminal of the transistor 802. For example, the gate terminal of the transistor 802 can be coupled to a current mirror, an op-amp, an OTA, a transistor/diode circuit configuration, a transistor configuration, or another voltage source, etc. that is configured to provide a voltage to control the gate terminal of the transistor 802. A bulk terminal of the transistor 802 can be coupled to a source terminal of the transistor 802. The source terminal of the transistor 802 can be coupled to a power supply (e.g., an external power supply, an internal power supply, a regulated power supply, etc.). A drain terminal of the transistor 802 can be coupled to the source terminal of the transistor 602. Furthermore, the drain terminal of the transistor 802 can be coupled to a terminal of the capacitor 804. Another terminal of the capacitor 804 can be coupled to the bulk terminal of the transistor 602 and a terminal of the resistor 806. Another terminal of the resistor 806 can receive the reference signal. Voltage of the reference signal can be higher than voltage of the output signal. Thus, threshold voltage of the transistor 602 can be increased. The increase of the threshold voltage of the transistor 602 can also increase DC voltage of the output signal, which can increase limit of signal excursion that can be processed while minimizing distortion and/or noise at an output terminal of the preamplifier 102 associated with the output signal (e.g., the terminal 508 shown in FIG. 5).

The capacitor 804 can be a capacitance employed to couple the output signal to the bulk terminal of the transistor 602. For example, the capacitor 804 can transmit the output signal to the bulk terminal of the transistor 602 to minimize the capacitive load of an input terminal of the preamplifier 102 that receives the input signal (e.g., the gate terminal of the transistor 602). An RC constant of the resistor 806 and the capacitor 804 can form a high-pass filter for the output signal and a low pass filter for the reference signal (e.g., DC voltage of the reference signal). A cut-off frequency f of the filter 302 can correspond to f=$1/(2\pi R*C)$, where R is a resistance of the resistor 806 and C is a capacitance of the capacitor 804. Accordingly, the filter 302 (e.g., the capacitor 804 and the resistor 806) can be employed to generate the control signal received by the bulk terminal of the transistor 602 based on the output signal and the reference signal. For example, an alternating current (AC) component of the control signal received by the bulk terminal of the transistor 602 can be determined by an AC component of the output signal. Furthermore, a DC level shift component of the control signal received by the bulk terminal of the transistor 602 can be determined based on the reference signal. In certain implementations, the circuit 800 can also include the set of diodes 706.

Figure 9:
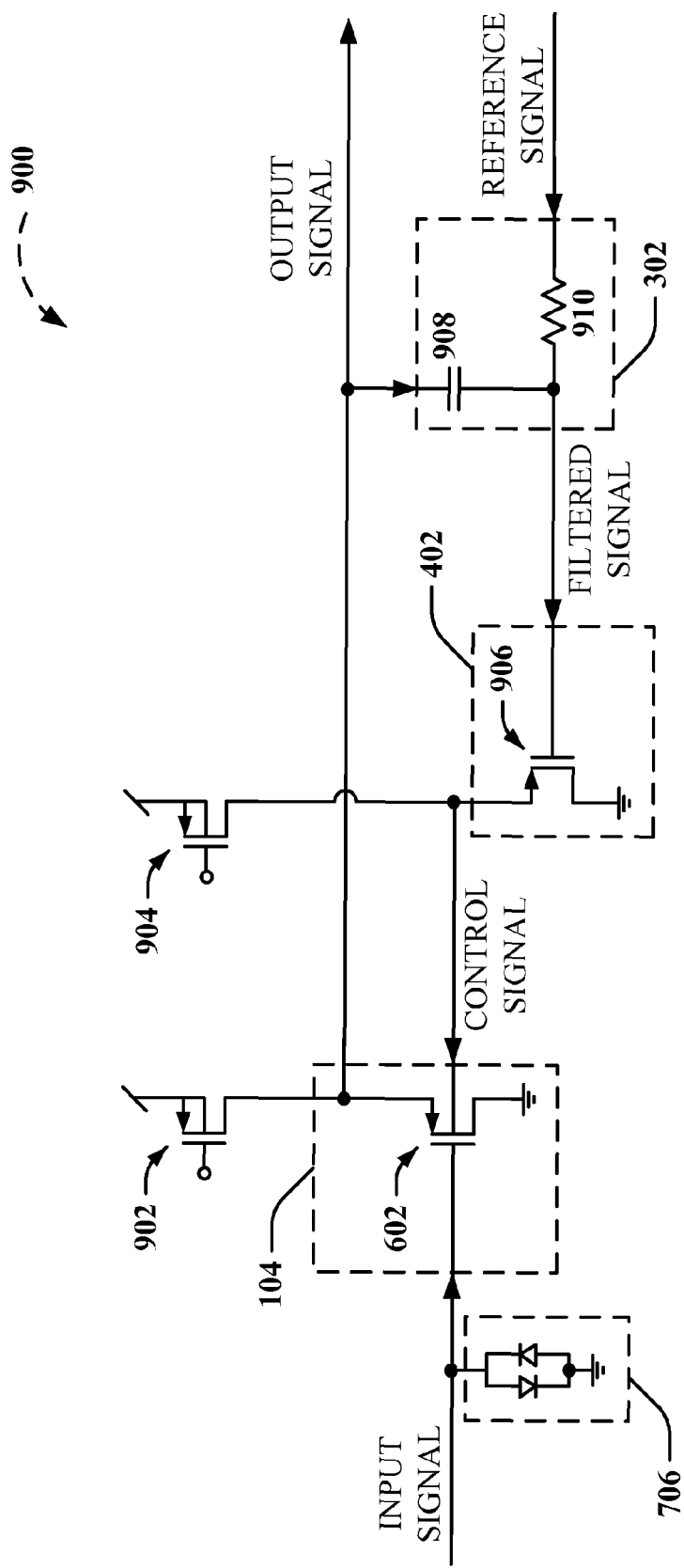
FIG. 9 depicts another non-limiting example of yet another circuit for a preamplifier, in accordance with various aspects and implementations described herein.

FIG. 9 depicts a circuit 900 for processing (e.g., conditioning) a signal associated with a microphone, according to various non-limiting aspects of the subject disclosure. The circuit 900 can correspond to the preamplifier 102. The circuit 900 includes the transistor 602, a transistor 902, a transistor 904, a transistor 906, a capacitor 908 and a resistor 910. For example, the filter 302 can include and/or be implemented as the capacitor 908 and/or the resistor 910. Furthermore, the buffer 402 can include and/or be implemented as the transistor 906 (e.g., the transistor 906 can be a transistor buffer). In one example, the transistor 902, the transistor 904 and/or the transistor 906 can be a MOSFET transistor. In certain implementations, rather than a resistor, the resistor 910 can be a switch capacitor resistor or a MOSFET transistor biased to act as a resistor.

The transistor 902 and the transistor 904 can be implemented as a current source (e.g., a bias current source). For example, the transistor 902 can provide a particular bias current to the transistor 602 and/or the transistor 904 can provide a particular bias current (e.g., a same or different bias current) to the transistor 906 (e.g., the transistor 902 can be employed to bias the transistor 602 and/or the transistor 904 can be employed to bias the transistor 906). A gate terminal of the transistor 902 can be coupled to a voltage source that generates a voltage to control the gate terminal of the transistor 902. For example, the gate terminal of the transistor 902 can be coupled to a current mirror, an op-amp, an OTA, a transistor/diode circuit configuration, a transistor configuration, or another voltage source, etc. that is configured to provide a voltage to control the gate terminal of the transistor 902. A bulk terminal of the transistor 902 can be coupled to a source terminal of the transistor 902. The source terminal of the transistor 902 can be coupled to a power supply (e.g., an external power supply, an internal power supply, a regulated power supply, etc.). A drain terminal of the transistor 902 can be coupled to the source terminal of the transistor 602. Furthermore, the drain terminal of the transistor 902 can be coupled to a terminal of the capacitor 908. Another terminal of the capacitor 908 can be coupled to a gate terminal of the transistor 906 and a terminal of the resistor 910. Another terminal of the resistor 910 can receive the reference signal. Voltage of the reference signal can be higher than voltage of the output signal.

A gate terminal of the transistor 904 can be coupled to a voltage source that generates a voltage to control the gate terminal of the transistor 904. For example, the gate terminal of the transistor 904 can be coupled to a current mirror, an op-amp, an OTA, a transistor/diode circuit configuration, a transistor configuration, or another voltage source, etc. In one example, the voltage source coupled to the gate terminal of the transistor 904 can be different than the voltage source coupled to the gate terminal of the transistor 902. In another example, the voltage source coupled to the gate terminal of the transistor 904 can correspond to the voltage source coupled to the gate terminal of the transistor 902. In an implementation, the gate terminal of the transistor 904 can be coupled to the gate terminal of the transistor 902. A bulk terminal of the transistor 904 can be coupled to a source terminal of the transistor 904. The source terminal of the transistor 904 can be coupled to a power supply (e.g., an external power supply, an internal power supply, a regulated power supply, etc.). In one example, the power supply coupled to the source terminal of the transistor 904 can be different than the power supply coupled to the source terminal of the transistor 902. In another example, the power supply coupled to the source terminal of the transistor 904 can correspond to the power supply coupled to the source terminal of the transistor 902. In an implementation, the source terminal of the transistor 904 can be coupled to the source terminal of the transistor 902. A drain terminal of the transistor 904 can be coupled to the bulk terminal of the transistor 602 and a source terminal of the transistor 906. A drain terminal of the transistor 906 can be coupled to ground.

The capacitor 908 can be a capacitance employed to couple the output signal to the gate terminal of the transistor 906. An RC constant of the resistor 910 and the capacitor 908 can form a high-pass filter for the output signal and a low pass filter for the reference signal (e.g., DC voltage of the reference signal). A cut-off frequency f1 of the filter 302 can correspond to f1=$1/(2\pi R1*C1)$, where R1 is a resistance of the resistor 910 and C1 is a capacitance of the capacitor 908. Accordingly, the filter 302 (e.g., the capacitor 908 and the resistor 910) can be employed to generate the filtered signal received by the gate terminal of the transistor 906 based on the output signal and the reference signal. For example, an alternating current (AC) component of the filtered signal received by the gate terminal of the transistor 906 can be determined by an AC component of the output signal. Furthermore, a DC level shift component of the filtered signal received by the gate terminal of the transistor 906 can be determined based on the reference signal.

The transistor 906 can be implemented between the filter 302 (e.g., the filter formed by the capacitor 908 and the resistor 910) and the bulk terminal of the transistor 602. The control signal can be transmitted to the bulk terminal of the transistor 602 via the source terminal of the transistor 906. For example, the output signal and a DC voltage associated with the reference signal can be transmitted to the bulk terminal of the transistor 602 via the transistor 906. Accordingly, impedance associated with the bulk terminal of the transistor 602 can be minimized. In certain implementations, the circuit 900 can also include the set of diodes 706.

Figure 10:
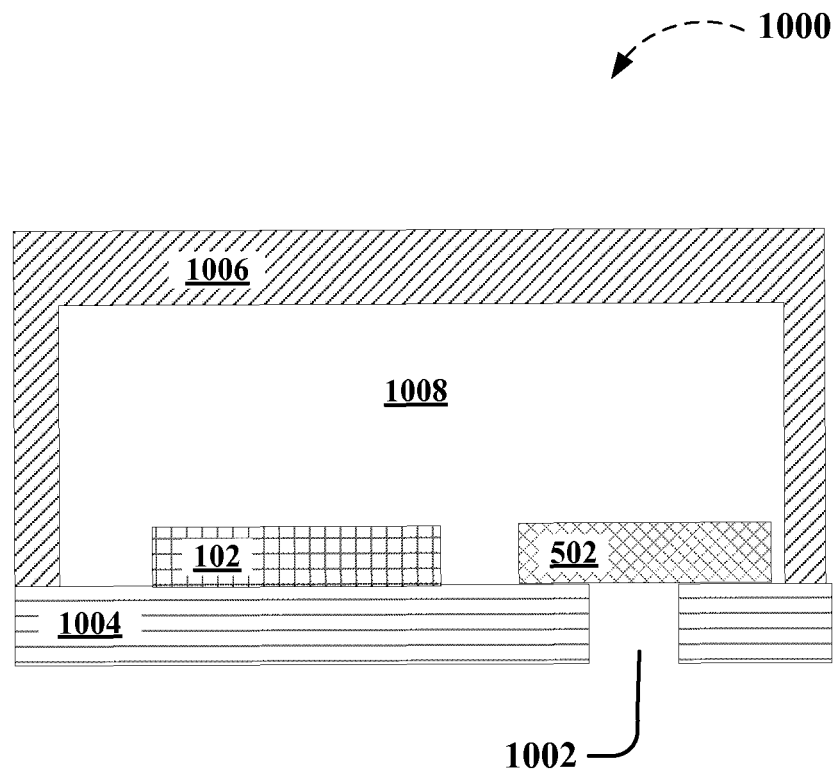
FIG. 10 depicts a non-limiting example of a microphone housing, in accordance with various aspects and implementations described herein.

FIG. 10 depicts a non-limiting embodiment of a microphone housing (e.g., a microphone module) 1000. The microphone housing 1000 can include at least the microphone component 502. In one example, the microphone component 502 can be a microphone sensor (e.g., an acoustic sensor). Therefore, in one example, the microphone housing 1000 can be a sensor package (e.g., a microphone sensor package). Additionally, the microphone housing 1000 can include the preamplifier 102. However, it is to be appreciated that, in certain implementations, the preamplifier 102 can be implemented outside the microphone housing 1000. In an aspect, the microphone housing 1000 can comprise an enclosure comprising a substrate (e.g., a sensor or microphone package substrate) 1004 and a lid 1006 that can house and define a cavity 1008 for the microphone component 502 and/or the preamplifier 102. The enclosure comprising the substrate 1004 and the lid 1006 can comprise an opening 1002. The opening 1002 can be an opening that is adapted to receive acoustic waves or acoustic pressure. The opening 1002 can alternatively be located in the lid 1006 for other configurations of the microphone housing 1000. The microphone component 502 and the preamplifier 102 can be mechanically affixed to the substrate 1004 and/or can be communicably coupled thereto. In an implementation, the preamplifier 102 can be communicably coupled to the microphone component 502 via the substrate 1004 and/or via bonding wire(s). Additionally or alternatively, the preamplifier 102 can be directly coupled to the microphone component 502.

Figure 11:
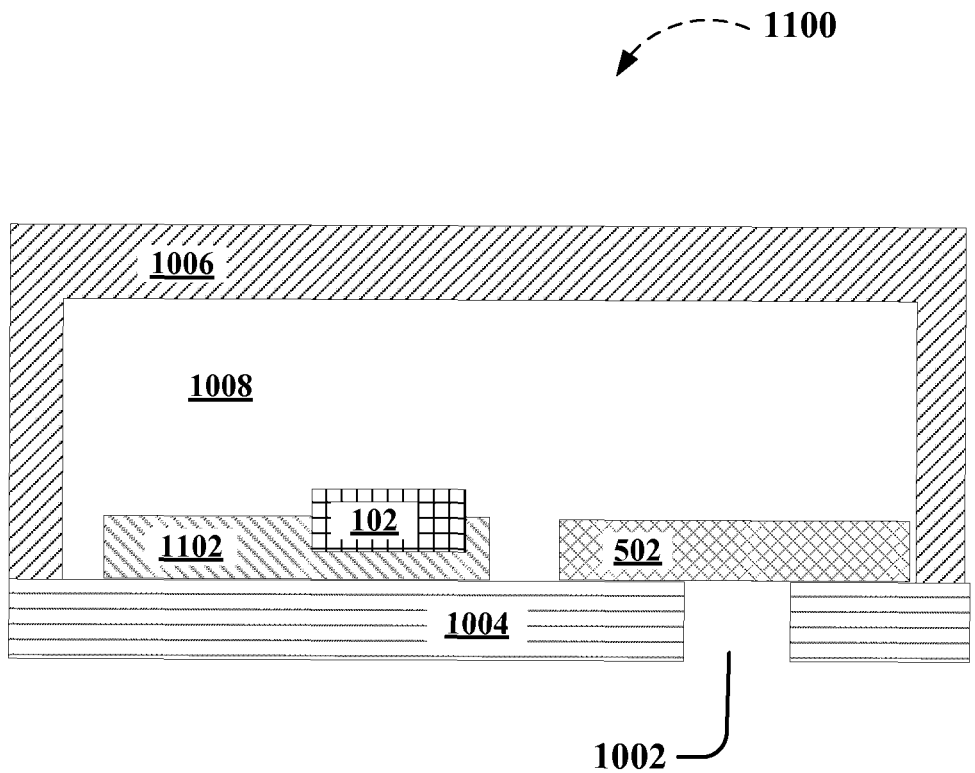
FIG. 11 depicts another non-limiting example of a microphone housing, in accordance with various aspects and implementations described herein.

FIG. 11 depicts a non-limiting embodiment of a microphone housing 1100. The microphone housing 1100 can comprise the opening 1002, the substrate 1004, the lid 1006, the cavity 1008, the microphone component 502 and the preamplifier 102. In the embodiment depicted in FIG. 11, the microphone housing 1100 can also comprise an ASIC 1102. The preamplifier 102 can be integrated with the ASIC 1102. For example, at least a portion of the ASIC 1102 can be associated with the preamplifier. The ASIC 1102 can be mechanically affixed to the substrate 1004. Additionally, the ASIC 1102 and can be communicably coupled to the microphone component 502 via the substrate 1004 and/or can be directly coupled to the microphone component 502. In an implementation, the microphone component 502 can be communicably coupled and mechanically affixed to the ASIC 1102 in addition to the preamplifier 102 or instead of the preamplifier 102. However, it is to be appreciated that the microphone component 502, the preamplifier 102 and/or the ASIC 1102 can be implemented in the microphone housing 1100 in a different manner.

While various embodiments for processing (e.g., conditioning) a signal associated with a microphone according to aspects of the subject disclosure have been described herein for purposes of illustration, and not limitation, it can be appreciated that the subject disclosure is not so limited. Various implementations can be applied to other areas for processing (e.g., conditioning) a signal, without departing from the subject matter described herein. For instance, it can be appreciated that other applications requiring a processed (e.g., conditioned) signal can employ aspects of the subject disclosure. Furthermore, various exemplary implementations of the preamplifier 102 as described can additionally, or alternatively, include other features, functionalities and/or components and so on, as further detailed herein, for example, regarding FIGS. 1-11.

Figure 12:
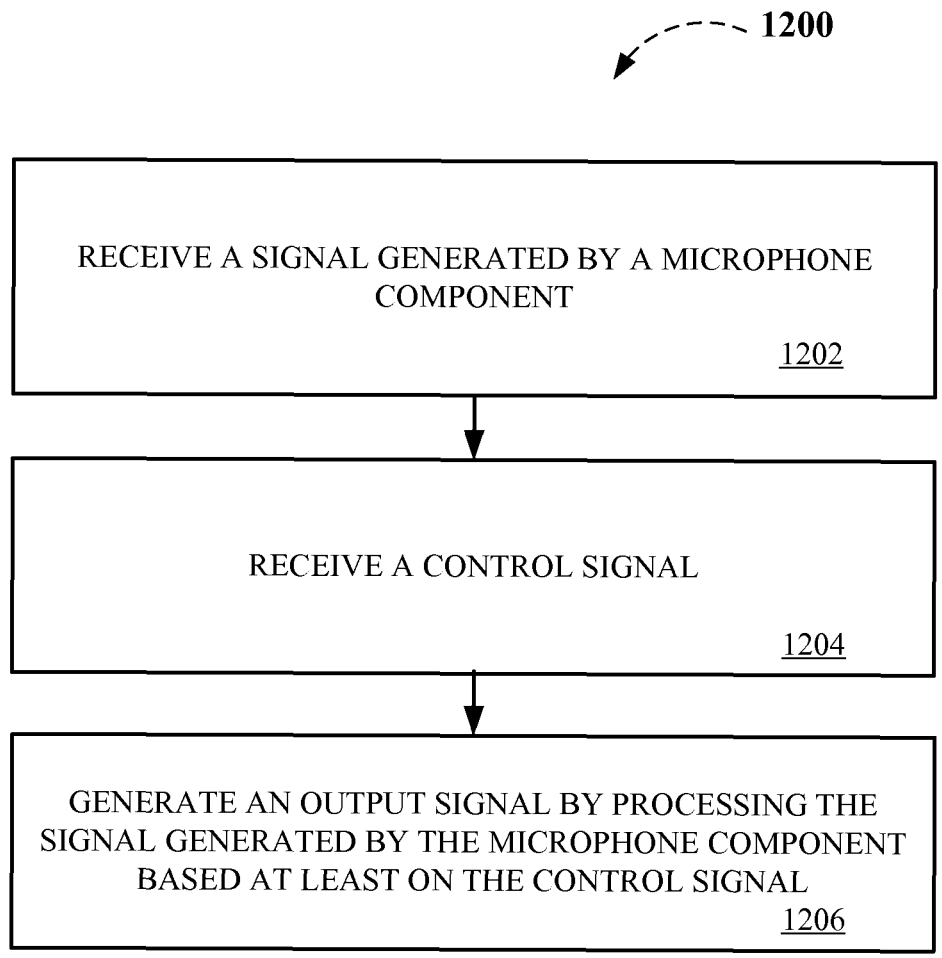
FIG. 12 is a flowchart of an example methodology for generating an output signal for a preamplifier, in accordance with various aspects and implementations described herein.
Figure 13:
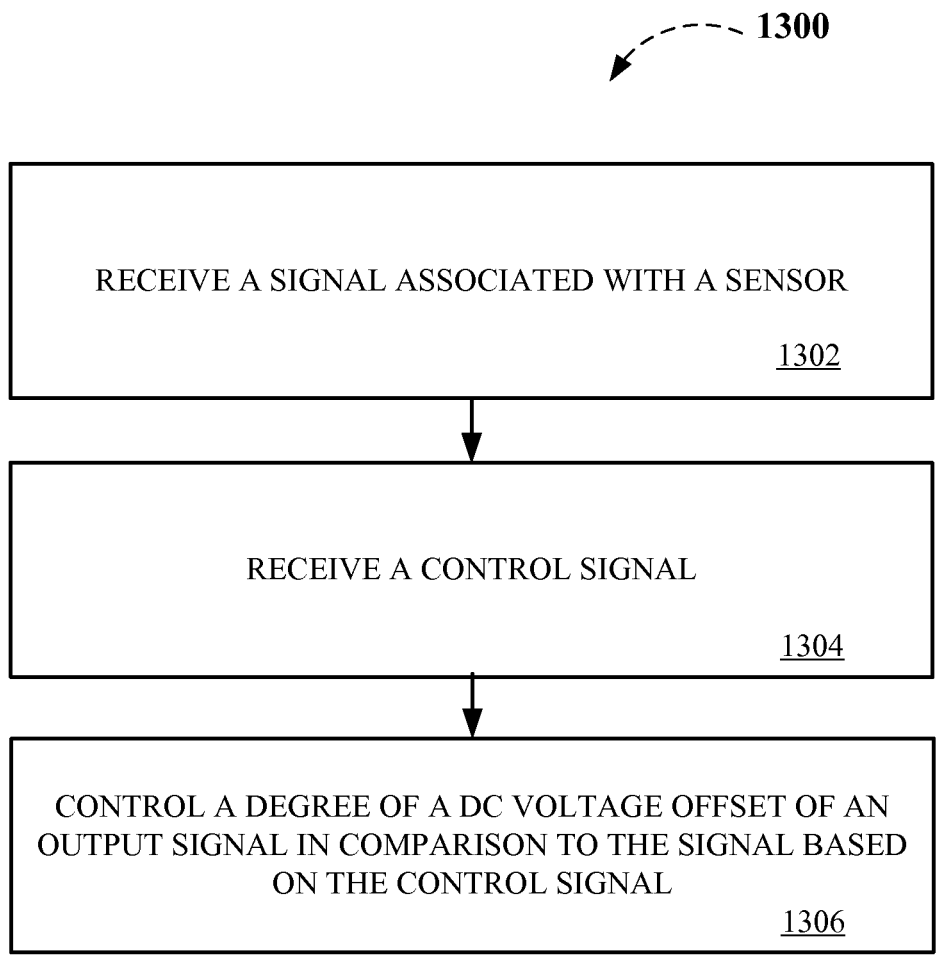
FIG. 13 is a flowchart of an example methodology for processing a signal associated with a sensor, in accordance with various aspects and implementations described herein.
Figure 14:
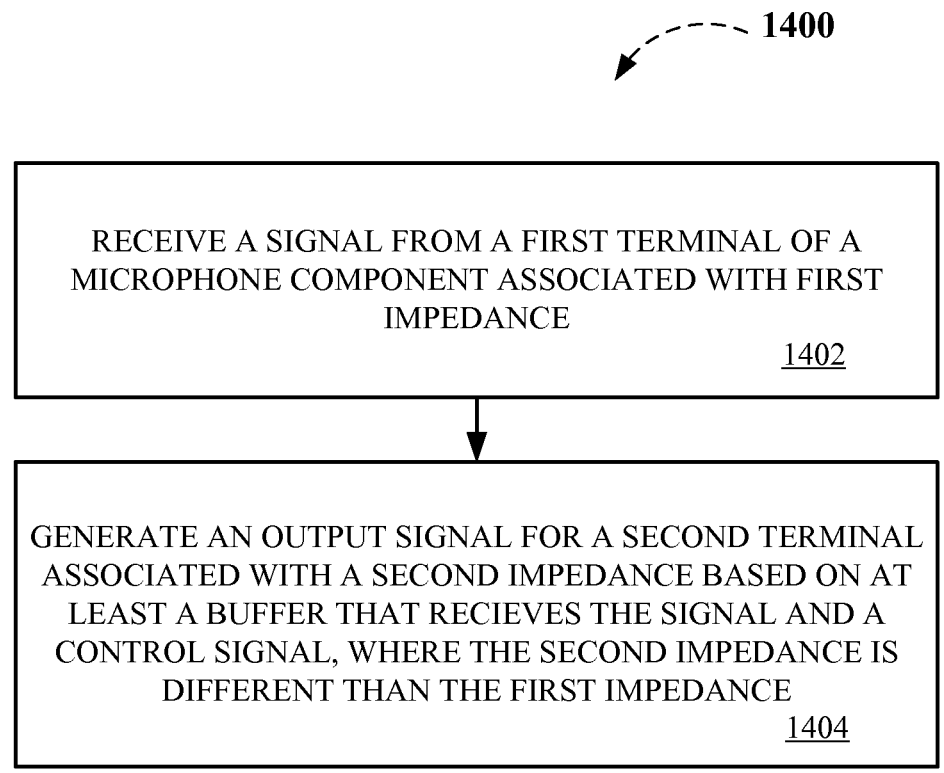
FIG. 14 is a flowchart of an example methodology for converting impedance associated with a microphone component, in accordance with various aspects and implementations described herein.

In view of the subject matter described supra, methods that can be implemented in accordance with the subject disclosure will be better appreciated with reference to the flowcharts of FIGS. 12-14. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 12 depicts an exemplary flowchart of a non-limiting method 1200 for generating an output signal for a preamplifier, according to various non-limiting aspects of the subject disclosure. Initially, at 1202, a signal generated by a microphone component is received. For example, a signal (e.g., a voltage) generated by a microphone sensor can be received. In one example, the microphone component can be a MEMS microphone component. In another example, the microphone component can be an ECM microphone component.

At 1204, a control signal is received. In one example, the control signal can be received from a voltage source. In another example, the control signal can be received from a filter. In yet another example, the control signal can be received from a buffer.

At 1206, an output signal is generated by processing the signal generated by the microphone component based at least on the control signal. For example, the output signal can include a DC voltage offset in comparison to the input signal. The control signal can control a degree of the DC voltage offset.

In an implementation, the control signal (e.g., a control voltage) can be generated based on a voltage source that receives the output signal. In another implementation, the control signal (e.g., a control voltage) can be generated based on a filter that receives the output signal and/or a reference signal. In yet another implementation, the control signal (e.g., a control voltage) can be generated based on a buffer coupled to a filter that receives the output signal and/or a reference signal.

FIG. 13 depicts an exemplary flowchart of a non-limiting method 1300 for processing a signal associated with a sensor, according to various non-limiting aspects of the subject disclosure. Initially, at 1302, a signal associated with a sensor is received. For example, the sensor can be a microphone sensor (e.g., a MEMS microphone sensor, an ECM microphone sensor, etc). At 1304, a control signal is received. At 1306, a degree of a DC voltage offset of an output signal in comparison to the signal is controlled based on the control signal. For example, the output signal can be a processed version (e.g., a conditioned version) of the input signal.

FIG. 14 depicts an exemplary flowchart of a non-limiting method 1400 for converting impedance associated with a microphone component, according to various non-limiting aspects of the subject disclosure. Initially, at 1402, a signal is received from a first terminal of a microphone component associated with a first impedance. At 1404, an output signal for a second terminal associated with a second impedance is generated based on at least a buffer that receives the signal and a control signal, where the second impedance is different than the first impedance. In one example, the second impedance can be lower than the first impedance. In an aspect, a third terminal can be coupled to the first terminal and can receive the signal. The third terminal can be coupled to the second terminal via at least the buffer. In an implementation, the second terminal and the third terminal can be associated with a preamplifier. The output signal can be transmitted via the second terminal.

It is to be appreciated that various exemplary implementations of exemplary methods 1200, 1300 and 1400 as described can additionally, or alternatively, include other process steps associated with features or functionality for processing (e.g., conditioning) a signal associated with a microphone, as further detailed herein, for example, regarding FIGS. 1-11.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A system, comprising:
    a microphone housing that comprises:
        a microphone component contained in a cavity of the microphone housing; and
        a preamplifier, contained in the cavity of the microphone housing, that comprises an input buffer configured to receive a signal generated by the microphone component and to generate an output signal that comprises a direct current (DC) voltage offset in comparison to the signal, wherein the preamplifier controls a degree of the DC voltage offset based on a control signal.

2. The system of claim 1, wherein the input buffer is a metal-oxide-semiconductor field-effect transistor (MOSFET) biased by a current source.

3. The system of claim 2, wherein a bulk terminal of the MOSFET is controlled by the control signal.

4. The system of claim 1, wherein the control signal is generated based on the output signal and a voltage source.

5. The system of claim 4, wherein the voltage source comprises a resistance where current flows from a terminal of the voltage source associated with the output signal to another terminal of the voltage source associated with the control signal.

6. The system of claim 4, wherein the voltage source comprises a level shifter.

7. The system of claim 1, wherein the control signal is generated by a filter that receives the output signal and a reference signal.

8. The system of claim 1, wherein the input buffer is coupled to a filter that receives the output signal and to another buffer that generates the control signal.

9. The system of claim 1, wherein the control signal is generated by a filter that comprises at least one of a resistor, a capacitor, an inductor or a combination thereof.

10. The system of claim 1, wherein the microphone component comprises a microelectromechanical systems (MEMS) microphone component or an electret condenser microphone (ECM) component.

11. The system of claim 1, wherein the output signal is a processed version of the signal generated by the microphone.

12. A device, comprising:
    an input buffer component configured to receive an input voltage associated with a sensor, to receive a control voltage, and to generate an output voltage based at least on the control voltage, wherein the input buffer is associated with a first impedance that is different than a second impedance associated with the sensor, and wherein the input buffer and the sensor are contained in a cavity of the device.

13. The device of claim 12, further comprising a voltage source component that generates the control voltage.

14. The device of claim 13, wherein the voltage source component comprises at least one of a resistor or a transistor.

15. The device of claim 12, further comprising a filter component configured to generate the control voltage based on the output voltage and a reference voltage.

16. The device of claim 15, wherein the filter component comprises at least one of a resistor, a capacitor or an inductor.

17. The device of claim 12, further comprising another buffer component configured to generate the control voltage based on a voltage generated by a filter component, wherein the filter component generates the voltage based on the output voltage and a reference voltage.

18. A method comprising:
receiving a voltage generated by a microphone component in response to an acoustic signal that is received by the microphone component via an opening in a microphone housing that contains the microphone component;
receiving a control voltage; and
generating an output voltage by processing the voltage generated by the microphone component based at least on the control voltage.

19. The method of claim 18, further comprising:
generating the control voltage based on the output voltage and a voltage source.

20. The method of claim 18, further comprising:
generating the control voltage based on a filter that receives the output voltage.

21. The method of claim 18, further comprising:
generating the control voltage based on a buffer coupled to a filter that receives the output voltage.

* * * * *